(12) United States Patent
Lee et al.

(10) Patent No.: US 9,293,425 B2
(45) Date of Patent: Mar. 22, 2016

(54) THIN FILM TRANSISTOR SUBSTRATE AND METHOD OF MANUFACTURING LIQUID CRYSTAL DISPLAY DEVICE USING THE SAME

(71) Applicant: Samsung Display Co., Ltd., Yongin, Gyeonggi-Do (KR)

(72) Inventors: Byungju Lee, Gunpo-si (KR); Sijin Kim, Seoul (KR); Sangah Koh, Guri-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/542,144

(22) Filed: Nov. 14, 2014

(65) Prior Publication Data

US 2015/0255409 A1 Sep. 10, 2015

(30) Foreign Application Priority Data

Mar. 4, 2014 (KR) .................. 10-2014-0025604

(51) Int. Cl.
*H01L 23/60* (2006.01)
*H01L 27/11* (2006.01)
*H01L 27/02* (2006.01)
*H01L 27/12* (2006.01)
*H01L 21/66* (2006.01)

(52) U.S. Cl.
CPC .............. *H01L 23/60* (2013.01); *H01L 22/30* (2013.01); *H01L 27/0248* (2013.01); *H01L 27/1108* (2013.01); *H01L 27/1214* (2013.01)

(58) Field of Classification Search
CPC ..... H01L 23/60; H01L 22/30; H01L 27/1108; H01L 27/0248; H01L 27/1214
See application file for complete search history.

(56) References Cited

U.S. PATENT DOCUMENTS

| | | | |
|---|---|---|---|
| 6,175,394 B1 | 1/2001 | Wu et al. | |
| 2002/0080292 A1* | 6/2002 | Zhang | ............... G02F 1/136204 349/40 |

FOREIGN PATENT DOCUMENTS

| | | |
|---|---|---|
| JP | H07-287249 | 10/1995 |
| JP | 2003-248235 | 9/2003 |
| KR | 10-2000-0027711 | 5/2000 |
| KR | 10-0495855 | 6/2005 |
| KR | 10-2006-0015176 | 2/2006 |
| KR | 10-2007-0033786 | 3/2007 |
| KR | 10-0980012 | 9/2010 |
| KR | 10-1200258 | 11/2012 |

* cited by examiner

*Primary Examiner* — Thanhha Pham
(74) *Attorney, Agent, or Firm* — Innovation Counsel LLP

(57) ABSTRACT

A thin film transistor substrate includes pixels disposed in a display area and connected to gate lines and data lines crossing the gate lines, a gate driver disposed in a non-display area adjacent to the display area and connected to the gate lines, signal pad parts disposed in the non-display area and connected to the gate driver and the data lines, test pad parts disposed in a cutting area adjacent to the non-display area and connected to the signal pad parts, static electricity dispersion parts disposed in the cutting area and connected to the plurality of test pad parts, and a guard line disposed in the cutting area and connected to the static electricity dispersion parts. The static electricity dispersion parts disperse a static electricity inflowing from the signal pad parts and the plurality of test pad parts to the guard line.

13 Claims, 7 Drawing Sheets

THIN FILM TRANSISTOR SUBSTRATE AND METHOD OF MANUFACTURING LIQUID CRYSTAL DISPLAY DEVICE USING THE SAME

CROSS-REFERENCE TO RELATED APPLICATION

This U.S. non-provisional patent application claims priority under 35 U.S.C. §119 to Korean Patent Application No. 10-2014-0025604, filed on Mar. 4, 2014, the contents of which are hereby incorporated by reference in its entirety.

BACKGROUND

1. Field of Disclosure

The present disclosure relates to a thin film transistor substrate and a method of manufacturing a liquid crystal display device using the same.

2. Description of the Related Art

In general, a display panel applied to a liquid crystal display device includes a thin film transistor substrate including thin film transistors formed thereon, a color filter substrate including color filters formed thereon, and a liquid crystal layer disposed between the thin film transistor substrate and the color filter substrate.

The thin film transistor substrate includes pixels, each of which is driven by a corresponding thin film transistor of the thin film transistors. Due to the thin film transistors, a pixel voltage is applied to the pixels and an alignment of liquid crystal molecules of the liquid crystal layer is changed by the pixel voltage. A transmittance of light passing through the liquid crystal layer is changed by the changed alignment of the liquid crystal molecules of the liquid crystal layer, and thus desired images are displayed.

When the thin film transistor substrate is manufactured, a rubbing process is performed to align the liquid crystal molecules in a predetermined direction. During the rubbing process, a static electricity is caused due to friction between the thin film transistor substrate and a rubbing cloth for the rubbing process. As a result, elements included in the thin film transistor substrate are damaged by the static electricity.

SUMMARY

The present disclosure provides a thin film transistor substrate capable of preventing elements thereof from being damaged due to static electricity during a rubbing process.

The present disclosure provides a method of manufacturing a liquid crystal display device using the thin film transistor substrate.

Embodiments of the inventive concept provide a thin film transistor substrate including a plurality of pixels disposed in a display area and connected to gate lines and data lines crossing the gate lines, a gate driver disposed in a non-display area adjacent to the display area and connected to the gate lines, a plurality of signal pad parts disposed in the non-display area and connected to the gate driver and the data lines, a plurality of test pad parts disposed in a cutting area adjacent to the non-display area and connected to the signal pad parts, a plurality of static electricity dispersion parts disposed in the cutting area and connected to the test pad parts test pad parts, and a guard line disposed in the cutting area and connected to the static electricity dispersion parts. The static electricity dispersion parts disperse a static electricity inflowing from the signal pad parts and the test pad parts test pad parts to the guard line.

The signal pad parts include a gate pad part connected to the gate driver and a plurality of data pad parts, each of which is connected to corresponding data lines of the data lines. The test pad parts test pad parts include a first test pad part connected to the gate pad part and a plurality of second test pad parts connected to corresponding data pad parts. The static electricity dispersion parts include a first static electricity dispersion part connected to the first test pad part and a plurality of second static electricity dispersion parts connected to corresponding second test pad parts.

When viewed in a plan view, the gate and data pad parts are disposed in the non-display area adjacent to an upper portion of the display area, the first and second test pad parts are disposed in the cutting area adjacent to an upper portion of the non-display area, and the first and second static electricity dispersion parts are disposed at an upper portion of the first and second test pad parts.

The gate pad part includes a plurality of gate pads connected to the gate driver and each of the data pad parts includes a plurality of data pads connected to the corresponding data lines of the data lines.

The first test pad part includes a plurality of first test pads connected to corresponding gate pads of the gate pads, and each of the second test pad parts includes a plurality of test pads connected to corresponding data pads of the data pads.

The gate driver sequentially applies gate signals to the pixels in response to first test signals provided through the first test pads and the gate pads, and the pixels receive second test signals through the second test pads and the data pads in response to the gate signals.

The first static electricity dispersion part includes a plurality of first diodes connected to corresponding first test pads and the guard line.

An anode of each of the first diode is connected to the corresponding first test pad and cathodes of the first diodes are connected to the guard line.

Each of the second static electricity dispersion part includes a plurality of second diodes, each of which is connected to corresponding second test pads and connected to the guard line.

An anode of each of the second diodes is connected to corresponding second test pads and cathodes of the second diodes are connected to the guard line.

Each of the second static electricity dispersion parts includes a first_second diode connected to odd-numbered second test pads of the second test pads of the corresponding second test pad part and the guard line; and a second_second diode connected to even-numbered second test pads of the second test pas of the corresponding second test pad part and the guard line. An anode of the first_second diode is connected to the odd-numbered second test pads, an anode of the second_second diode is connected to the even-numbered second test pads, and cathodes of the first_second and second_second diodes are connected to the guard line.

The guard line is disposed to be adjacent to an edge of the thin film transistor substrate and extends along the edge of the thin film transistor substrate, and the guard line disposed in the cutting area adjacent to the upper portion of the non-display area is disposed above the first and second static electricity dispersion parts when viewed in a plan view.

Embodiments of the inventive concept provide a method of manufacturing a liquid crystal display, including preparing a thin film transistor substrate including a plurality of pixels connected to gate lines and data lines, a gate driver connected to the gate lines, a plurality of signal pad parts connected to the gate driver and data lines, a plurality of test pad parts connected to the signal pad parts, a plurality of static electricity dispersion parts connected to the plurality of test pad parts, and a guard line connected to the static electricity dispersion parts, performing a rubbing process on an alignment layer coated on the thin film transistor substrate, dispersing a static electricity occurring in the signal pad parts and the plurality of test pad parts during the rubbing process to the guard line through the static electricity dispersion parts, removing the plurality of test pad parts, the static electricity dispersion parts, and the guard line, disposing a color filter substrate to face the thin film transistor substrate, and disposing a liquid crystal layer between the thin film transistor substrate and the color filter substrate.

According to the above, the thin film transistor substrate and the manufacturing method of the liquid crystal display device may prevent the elements from being damaged due to the static electricity occurring during the rubbing process.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
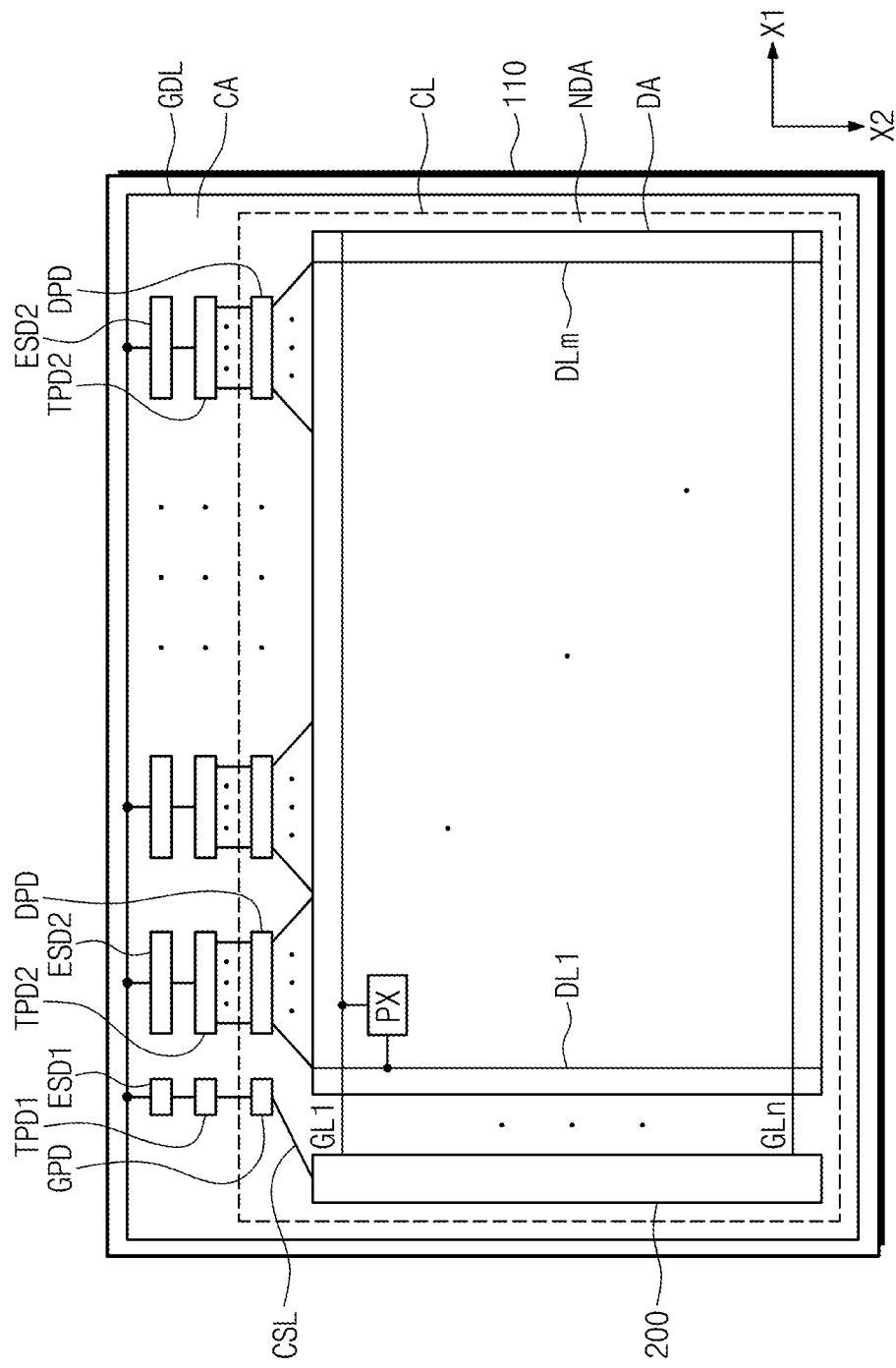
FIG. 1 is a plan view showing a thin film transistor substrate according to an exemplary embodiment of the present disclosure.

It will be understood that when an element or layer is referred to as being "on", "connected to" or "coupled to" another element or layer, it can be formed directly on, connected or coupled to the other element or layer directly, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a plan view showing a thin film transistor substrate according to an exemplary embodiment of the present disclosure.

Referring to FIG. 1, a thin film transistor substrate 110 includes a plurality of pixels PXs, a plurality of gate lines GL1 to GLn, a plurality of data lines DL1 to DLm, a gate driver 200, a plurality of signal pad parts GPD and DPD, a plurality of test pads TPD1 and TPD2, a plurality of static electricity dispersion parts ESD1 and ESD2, and a guard line GDL.

The thin film transistor substrate 110 includes a display area DA, a non-display area NDA adjacent to the display area DA, and a cutting area CA adjacent to the non-display area NDA when viewed in a plan view. A boundary area between the non-display area NDA and the cutting area CA is referred to as a cutting line CL.

The pixels PXs are arranged in the display area DA. For the convenience of explanation, FIG. 1 shows only one pixel PX, but the pixels PXs are arranged in the display area DA in a matrix form. For instance, the pixels PXs are arranged in n rows by m columns. In the present exemplary embodiment, each of "n" and "m" is an integer number greater than zero (0). Each of the pixels PXs is connected to a corresponding gate line of gate lines GL1 to GLn and a corresponding data line of data lines DL1 to DLm.

Although not shown in FIG. 1, each of the pixels PXs includes a thin film transistor and a pixel electrode connected to the thin film transistor. The thin film transistor is connected to the corresponding gate line and the corresponding data line.

The gate lines GL1 to GLn are insulated from the data lines DL1 to DLm while crossing the data lines DL1 to DLm. The gate lines GL1 to GLn extend in a first direction X1 and are connected to the gate driver 200.

The data lines DL1 to DLm extend in a second direction X2 crossing the first direction X1. The data lines DL1 to DLm extend in the non-display area NDA adjacent to an upper portion of the display area DA in a plan view and are connected to the data pad parts DPD.

The gate driver 200 is disposed in the non-display area NDA adjacent to a left side of the display area DA. The gate driver 200 is disposed in the non-display area NDA adjacent to the left side of the display area DA in an amorphous silicon TFT gate driver circuit (ASG) manner, but it should not be limited thereto or thereby.

The signal pad parts GPD and DPD are disposed in the non-display area NDA adjacent to the upper portion of the display area DA. The signal pad parts GPD and DPD are connected to the gate driver 200 and the data lines DL1 to DLm, respectively.

In detail, the signal pad parts GPD and DPD include a gate pad part GPD and a plurality of data pad parts DPD. The gate pad part GPD is connected to the gate driver 200 through a control signal line part CSL. Each of the data pad parts DPD is connected to a plurality of data lines.

The test pad parts TPD1 and TPD2 are disposed in the cutting area CA adjacent to an upper portion of the non-display area NDA when viewed in a plan view. The test pad parts TPD1 and TPD2 are connected to the signal pad parts GPD and DPD.

The test pad parts TPD1 and TPD2 includes a first test pad part TPD1 and a plurality of second test pad parts TPD2. The first test pad part TPD1 is connected to the gate pad part GPD, and each of the second test pad parts TPD2 is connected to a corresponding data pad part of the data pad parts DPD.

The static electricity dispersion parts ESD1 and ESD2 are disposed in the cutting area CA adjacent to the upper portion of the non-display area NDA when viewed in a plan view and connected to the test pads parts TPD1 and TPD2. The static electricity dispersion parts ESD1 and ESD2 are disposed above the test pad parts TPD1 and TPD2 when viewed in a plan view.

The static electricity dispersion parts ESD1 and ESD2 includes a first static electricity dispersion part ESD1 and a plurality of second static electricity dispersion parts ESD2. The first static electricity dispersion part ESD1 is disposed between the first test pad part TPD1 and the guard line GDL, and connected to the first test pad part TPD1 and the guard line GDL. The second static electricity dispersion parts ESD2 are disposed between the first test pad part TPD 1 and the guard line GDL, and connected to the second test pad parts TPD2 and the guard line GDL.

The guard line GDL is disposed in the cutting area CA to be adjacent to an edge of the thin film transistor substrate 110. The guard line GDL extends along the edge of the thin film transistor substrate 110. The guard line GDL is in a floating state.

The guard line GDL disposed in the cutting area CA adjacent to the upper portion of the non-display area NDA is disposed outside of the first and second static electricity dispersion parts ESD1 and ESD2 when viewed in a plan view. The first and second static electricity dispersion parts ESD 1 and ESD2 are connected to the guard line GDL.

When the thin film transistor substrate 110 is manufactured, an inspection process that checks whether a defect occurs or not, and an alignment process are performed. For instance, first test signals are applied to the first test pad TPD1 and second test signals are applied to the second test pads TPD2.

The first test signals are applied to the gate driver 200 through the first test pad part TPD1, the gate pad part GPD, and the control signal line part CSL, which are connected to each other. The gate driver 200 outputs gate signals in response to the first test signals. The gate signals are sequentially applied to the pixels PXs through the gate lines GL1 to GLn in the unit of row.

The second test signals are applied to the pixels PXs through the second test pad parts TPD2, the data pad parts DPD, and the data lines DL1 to DLm, which are connected to each other. The second test signals may be data voltages having a predetermined voltage level.

The pixels PXs receive the data voltages in response to the gate signals. The thin film transistor of each pixel PX is turned on in response to the gate signal provided through the corresponding gate line. The turned-on thin film transistor applies the data voltage, which is provided through the corresponding data line, to the pixel electrode.

When the driving state of the pixels PXs is inspected, the defect occurring in the thin film transistor substrate 110 may be checked. For instance, the defect in the pixels PXs may be inspected by using a modulator (not shown). The modulator includes a transparent electrode layer and an electro-optical material layer containing liquid crystal molecules. A position of the modulator is set such that the electro-optical material layer is disposed between the transparent electrode layer and the pixel electrode.

A predetermined voltage is applied to the transparent electrode layer of the modulator, and an electric field is generated between the transparent electrode layer applied with the predetermined voltage and the pixel electrodes applied with the data voltages. The alignment of the liquid crystal molecules of the electro-optical material layer is changed by the electric field, and thus the electro-optical material layer is driven. When the light transmittance of the electro-optical material layer driven by the electric field is inspected, the defects occurring in the pixels PXs may be checked.

When the thin film transistor substrate 110 is applied to the liquid crystal display device, an alignment process is performed to allow the liquid crystal molecules to be aligned in a uniform direction. For the alignment process, a polymer alignment layer is coated on the thin film transistor substrate 110 and the rubbing process is performed using the rubbing cloth. As the polymer alignment layer, polyimide is used.

For the rubbing process, the rubbing cloth in a velvet shape, e.g., rayon, cotton, etc., is used. A roller wrapped with the rubbing cloth rotates at a uniform velocity to pass over the thin film transistor substrate 110 coated with the alignment layer in a uniform direction. Therefore, the alignment of the liquid crystal molecules may be controlled.

During the rubbing process, the static electricity is generated due to friction between the rubbing cloth and the first test pad part TPD1 and between the rubbing cloth and the second test pad parts TPD2. In addition, the static electricity is generated due to friction between the rubbing cloth and the gate pad part GPD and between the rubbing cloth and the data pad parts DPD.

The static electricity flows to the gate driver 200 through the first test pad part TPD1 and the gate pad part GPD and flows to the pixels PXs through the second test pad parts TPD2 and the data pad parts DPD. In this case, elements of the gate driver 200 and the thin film transistors of the pixels PXs may be damaged by the static electricity.

The static electricity occurring during the rubbing process is dispersed to the guard line GDL through the first and second static electricity dispersion parts ESD1 and ESD2. When the static electricity is dispersed, the amount of the static electricity applied to the gate driver 200 and the pixels PXs is reduced. Thus, although the static electricity occurs during the rubbing process, the elements of the gate driver 200 and the thin film transistors of the pixels PXs may be prevented from being damaged.

Consequently, the thin film transistor substrate 110 may be prevented from damage due to the static electricity occurring during the rubbing process.

Figure 2:
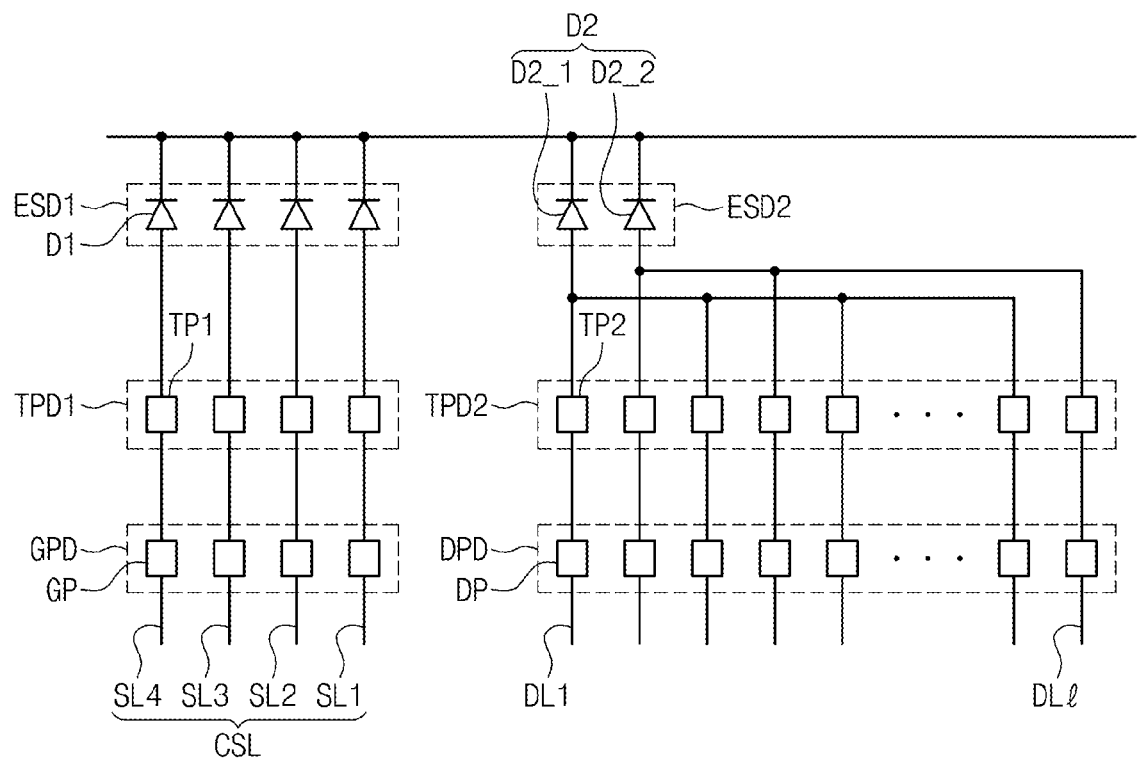
FIG. 2 is a view showing gate and data pad parts, first and second test pad parts, and first and second static electricity dispersion parts shown in FIG. 1.
Figure 3:
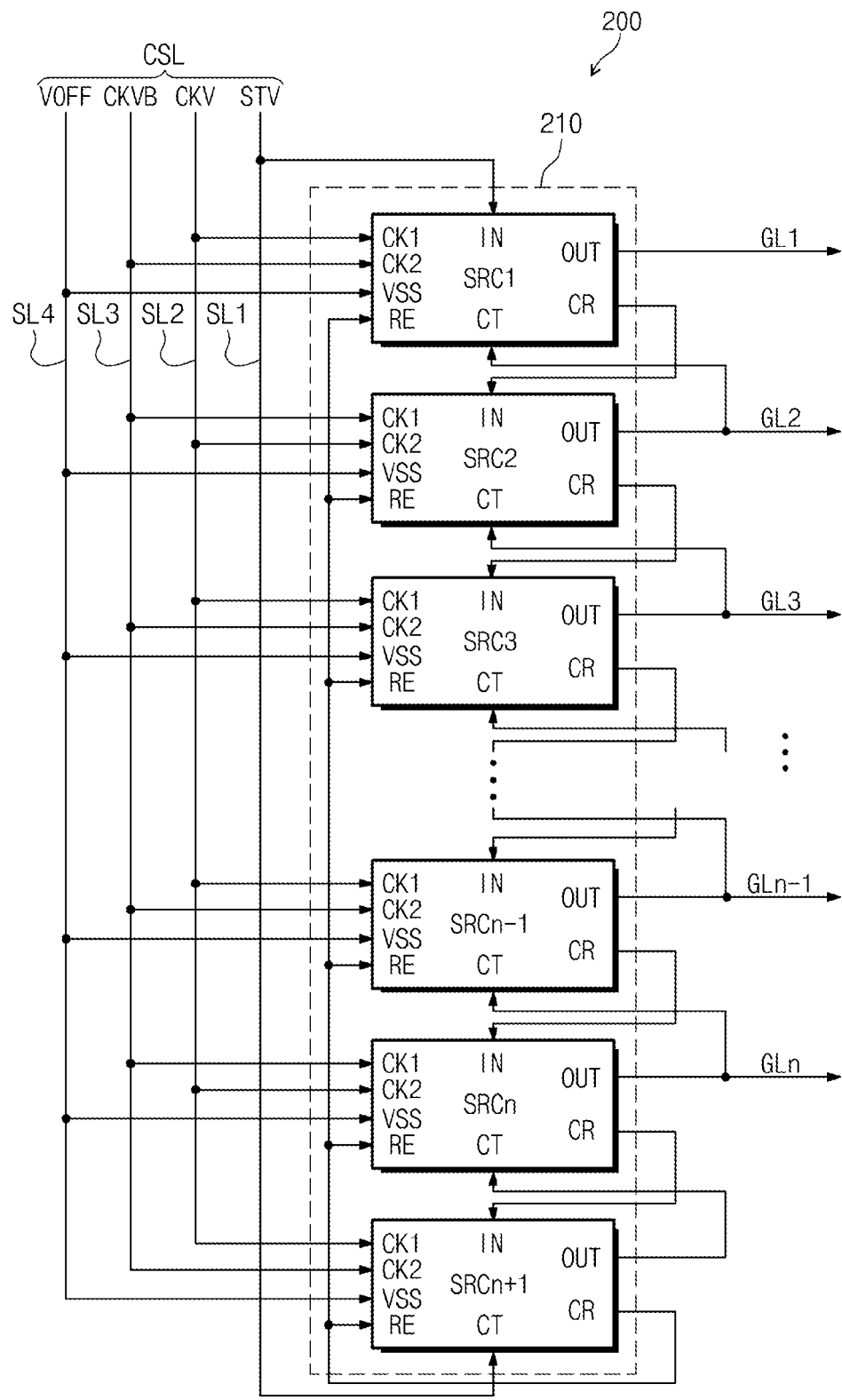
FIG. 3 is a block diagram showing a gate driver shown in FIG. 1.

FIG. 2 is a view showing the gate and data pad parts, the first and second test pad parts, and the first and second static electricity dispersion parts shown in FIG. 1, and FIG. 3 is a block diagram showing a gate driver shown in FIG. 1.

For the convenience of explanation, FIG. 2 shows one data pad part DPD, one second test pad part TPD2, and one second static electricity dispersion part ESD2. The other data pad parts DPD, second test pad parts TPD2, and second static electricity dispersion parts ESD2, which are not shown in FIG. 2, have the same structure and function as those of the data pad part DPD, the second test pad part TPD2, and the second static electricity dispersion part ESD2 shown in FIG. 2.

Referring to FIG. 2, the control signal line CSL includes a plurality of signal lines SL1 to SL4. The signal lines SL1 to SL4 includes first, second, third, and fourth signal lines SL1 to SL4.

The gate pad part GPD includes a plurality of gate pads GP respectively corresponding to the first to fourth signal lines SL1 to SL4. That is, the gate pad part GPD includes four gate pads GP. The gate pads GP are connected to the first to fourth signal lines SL1 to SL4, respectively.

The first test pad part TPD1 includes a plurality of first test pads TP1 corresponding to the gate pads GP. That is, the first test pad part TPD1 includes four first test pads TP1. The first test pads TP1 are connected to the gate pads GP, respectively.

The first static electricity dispersion part ESD1 includes a plurality of first diodes D1 corresponding to the first test pads TP1. That is, the first static electricity dispersion part ESD1 includes four first diodes D1.

The first diodes D1 are connected to the first test pads TP1 and the guard line GDL. Anodes of the first diodes D1 are connected to the first test pads TP1, respectively. Cathodes of the first diodes D1 are connected to the guard line GDL.

The data pad part DPD is connected to a plurality of data lines DL1 to DLl. In the present exemplary embodiment, "l" is an integer number greater than zero (0) and smaller than "m". The data pad part DPD includes a plurality of data pads DP corresponding to the data line DL1 to DLl. That is, the data pad part DPD includes l data lines DP. The data pads DP are connected to the data lines DL1 to DLl. respectively.

The second test pad part TPD2 includes a plurality of second test pads TP2 corresponding to the data pads DP. That is, the second test pad part TPD2 includes l second test pads TP2. The second test pads TP2 are connected to the data pads DP, respectively The second static electricity dispersion part ESD2 includes a plurality of second diodes D2. Each of the second diodes D2 is connected to a plurality of second test pads TP2 and the guard line GDL. Anodes of the second diodes D2 are connected to the plurality of corresponding second test pads TP2, respectively. Cathodes of the second diodes D2 are connected to the guard line GDL.

For instance, the second diodes D2 include a first_second diode D2_1 and a second_second diode D2_2. The anode of the first_second diode D2_1 is connected to odd-numbered second test pads TP2 of the second test pads TP2. The anode of the second_second diode D2_2 is connected to even-numbered second test pads TP2 of the second test pads TP2. Cathodes of the first_second diode D2_1 and the second_second diode D2_2 are connected to the guard line GDL.

Referring to FIG. 3, the gate driver 200 includes a shift register 210. The shift register 210 includes first to (n+1)th stages SRC1 to SRCn+1 connected to each other one after another. The first to n-th stages SRC1 to SRCn are driving stages and the (n+1)th stage SRCn+1 is a dummy stage. The first to n-th stages SRC1 to SRCn are electrically connected to first to n-th gate lines GL1, . . . , GLn to sequentially output the gate signals.

Each of the stages SRC1 to SRCn+1 includes a first clock terminal CK1, a second clock terminal CK2, an off-voltage terminal VSS, a reset terminal RE, a control terminal CT, a carry terminal CR, an output terminal OUT, and an input terminal IN.

The first clock terminal CK1 receives a clock signal having a phase opposite to a clock signal applied to the second clock terminal CK2. For instance, the first clock terminals CK1 of odd-numbered stages SRC1, SRC3, . . . , SRCn−1 receive a first clock signal CKV, and the second clock terminals CK2 of the odd-numbered stages SRC1, SRC3, . . . , SRCn−1 receive a second clock signal CKVB having the phase opposite to that of the first clock signal CKV. On the contrary, the first clock terminals CK1 of even-numbered stages SRC2, SRC4, . . . , SRCn receive the second clock signal CKVB, and the second clock terminals CK2 of the even-numbered stages SRC2, SRC4, . . . , SRCn receive the first clock signal CKV.

The input terminal IN of the first stage SRC1 and a control terminal CT of the dummy stage SRCn+1 receive a vertical start signal STV. The input terminal IN of each of second to (n+1)th stages SRC2 to SRCn+1 receives a carry signal output from the carry terminal CR of a previous stage. The carry signal output from the carry terminal CR drives a next stage.

The control terminal CT of each of the first to n-th stages SRC1 to SRCn receives the gate signal output from the output terminal OUT of the next stage. The off-voltage terminals VSS of the first to (n+1)th stages SRC1 to SRCn+1 receive an off-voltage VOFF. The reset terminals RE of the first to (n+1) th stages SRC1 to SRCn+1 commonly receive the carry signal output from the carry terminal CR of the (n+1)th stage SRCn+1.

When the first and second clock signals CKV and CKVB are at a high level, the first and second clock signals CKV and CKVB may serve as a gate-on voltage to drive the pixels, and when the first and second clock signals CKV and CKVB are at a low level, the first and second clock signals CKV and CKVB may serve as a gate-off voltage. The output terminals OUT of the first to (n+1)th stages SRC1 to SRCn+1 output the clock signal at the high level, which is applied to the first clock terminal CK1.

For instance, the output terminals OUT of the odd-numbered stages SRC1, SRC3, . . . , SRCn−1 output the first clock signal CKV at the high level. The output terminals OUT of the even-numbered stages SRC2, SRC4, . . . , SRCn output the second clock signal CKVB at the low level. The carry terminals CR of the first to (n+1)th stages SRC1 to SRCn+1 output the carry signal based on the same clock signal as the clock signal output from the output terminal OUT.

The first test signal CSL includes the vertical start signal STV, the first clock signal CKV, the second clock signal CKVB, and the off-voltage VOFF.

The first signal line SL1 is electrically connected to the input terminal IN of the first stage SRC1 and the control terminal CT of the dummy stage SRCn+1 to apply the vertical start signal STV to the first stage SRC1 and the (n+1)th stage SRCn+1. The second signal line SL2 is electrically connected to the first clock terminals CK1 of the odd-numbered stages SRC1, SRC3, . . . , SRCn−1 and the second clock terminals CK2 of the even-numbered stages SRC2, SRC4, . . . , SRCn to apply the first clock signal CKV to the first clock terminals CK1 of the odd-numbered stages SRC1, SRC3, ..., SRCn−1 and the second clock terminals CK2 of the even-numbered stages SRC2, SRC4, ..., SRCn.

The third signal lines SL3 is electrically connected to the first clock terminals CK1 of the even-numbered stages SRC2, SRC4, ..., SRCn and the second clock terminals CK2 of the odd-numbered stages SRC1, SRC3, ..., SRCn−1 to apply the second clock signal CKVB to the first clock terminals CK1 of the even-numbered stages SRC2, SRC4, ..., SRCn and the second clock terminals CK2 of the odd-numbered stages SRC1, SRC3, ..., SRCn−1. The fourth signal line SL4 is electrically connected to the off-voltage terminals VSS of the stages SRC1 to SRCn+1 to apply the off-voltage VOFF to the stages SRC1 to SRCn+1.

When the thin film transistor substrate 110 is inspected, the first test signals are applied to the first test pads TP1 of the first test pad part TPD1 and the second test signals are applied to the second test pads TP2 of the second test pad TPD2.

The vertical start signal STV, the first clock signal CKV, the second clock signal CKVB, and the off-voltage VOFF of the first test signals are applied to the gate driver 200 through the first test pads TP1, the gate pads GPD, and the first to fourth signal lines SL1 to SL4. The second test signals are applied to the pixels PXs through the second test pads TP2, the data pads DP, and the data lines DL1 to DL1.

The method of inspecting the thin film transistor substrate 110 using the first and second test signals has been described as the above.

During the rubbing process, the static electricity occurs due to friction between the rubbing cloth and the first test pads TP1 and between the rubbing cloth and the second test pads TP2. In addition, the static electricity occurs due to the friction between the rubbing cloth and the gate pads GP and between the rubbing cloth and the data pads DP.

The static electricity caused by the friction between the rubbing cloth and the first test pads TP1 and between the rubbing cloth and the second test pads TP2 is dispersed to the guard line GDL through the first diodes D1. The static electricity caused by the friction between the rubbing cloth and the gate pads GP and between the rubbing cloth and the data pads DP is dispersed to the guard line GDL through the second diodes D2.

In the above description, the static electricity is dispersed using two second diodes D2, but the number of the second diodes D2 should not be limited to two.

Consequently, the thin film transistor substrate 110 may prevent the damage caused by the static electricity occurring during the rubbing process.

Figure 4:
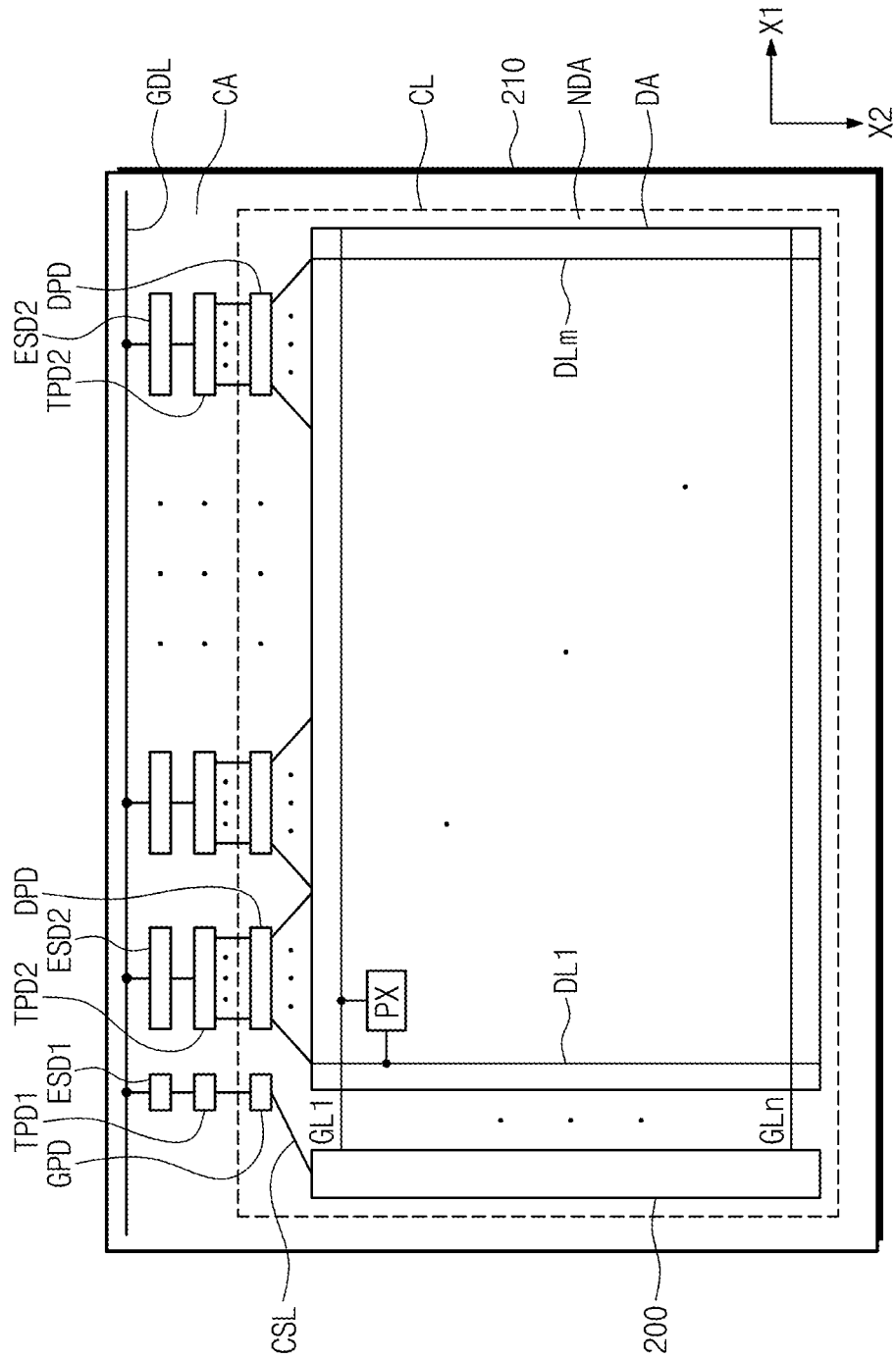
FIG. 4 is a plan view showing a thin film transistor substrate according to another exemplary embodiment of the present disclosure.

FIG. 4 is a plan view showing a thin film transistor substrate according to another exemplary embodiment of the present disclosure.

A thin film transistor substrate 210 shown in FIG. 4 has the same structure and function as those of the thin film transistor substrate 110 shown in FIG. 1 except for the guard line GDL. Accordingly, hereinafter only the structure of the guard line GDL will be described in detail.

Referring to FIG. 4, the guard line GDL is disposed at a position adjacent to an upper boundary of the thin film transistor substrate 210 when viewed in a plan view and extends in the first direction X1. The guard line GDL is disposed in the cutting area CA adjacent to the upper portion of the non-display area NDA and disposed outside of the first and second static electricity dispersion parts ESD1 and ESD2 in a plan view. The first and second static electricity dispersion parts ESD1 and ESD2 are connected to the guard line GDL.

The static electricity occurring in the thin film transistor substrate 210 during the rubbing process is dispersed to the guard line GDL through the first and second static electricity dispersion parts ESD1 and ESD2.

Consequently, the thin film transistor substrate 210 may prevent the elements from the damage caused by the static electricity occurring during the rubbing process.

Figure 5A:
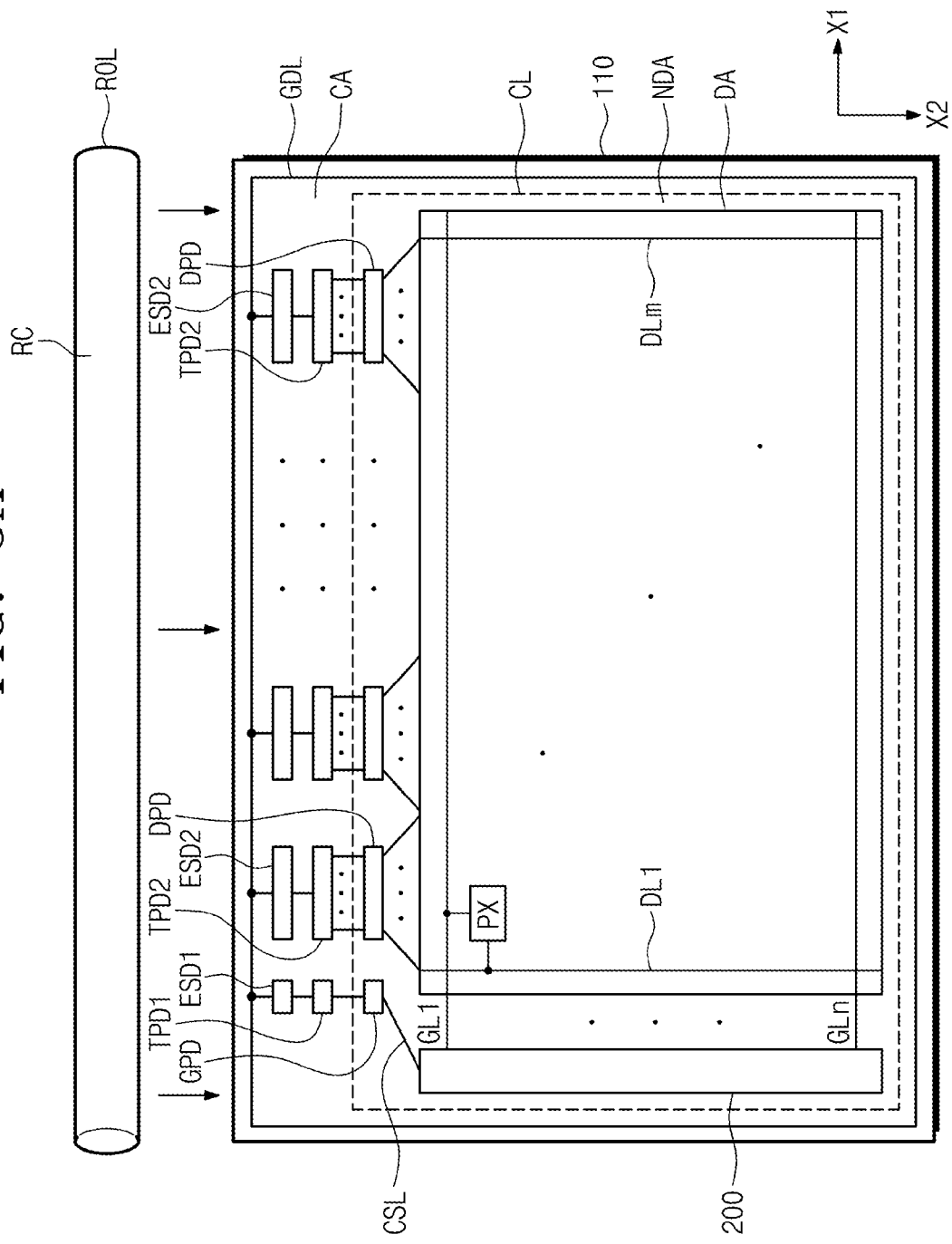
FIGS. 5A to 5C are views showing a manufacturing method of a liquid crystal display device using the thin film transistor substrate shown in FIG. 1.
Figure 5B:
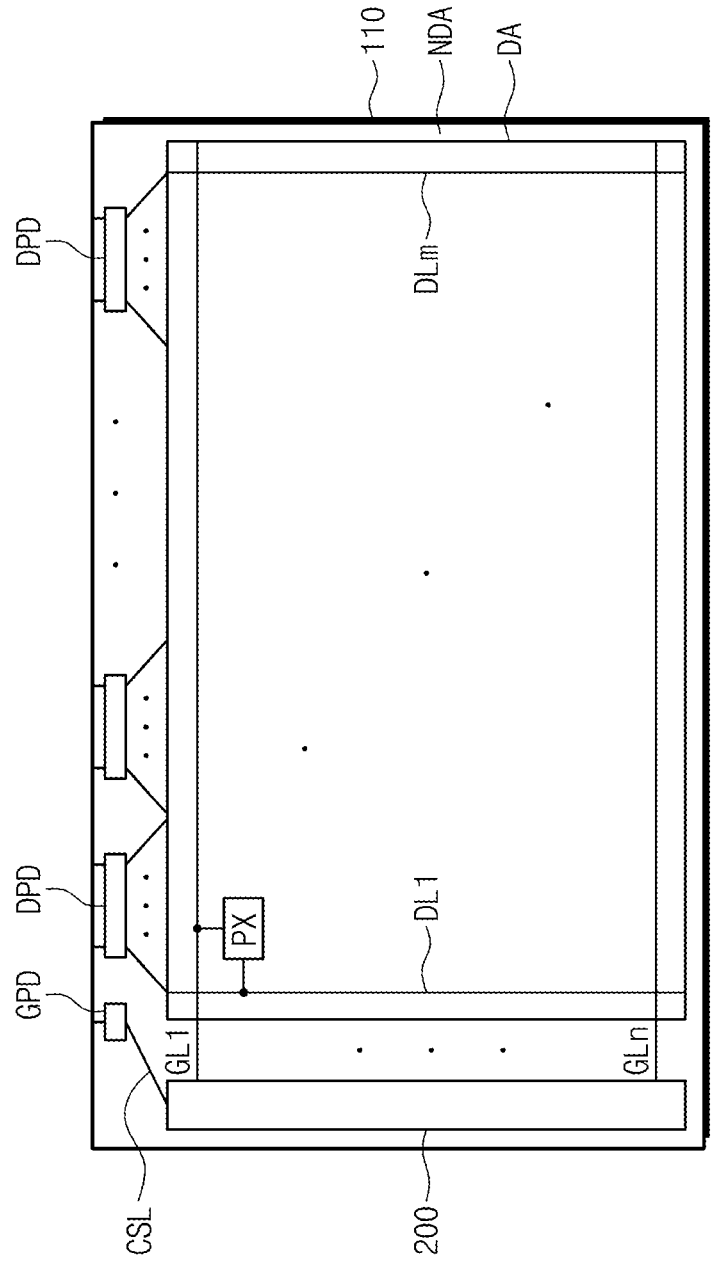
Figure 5C:
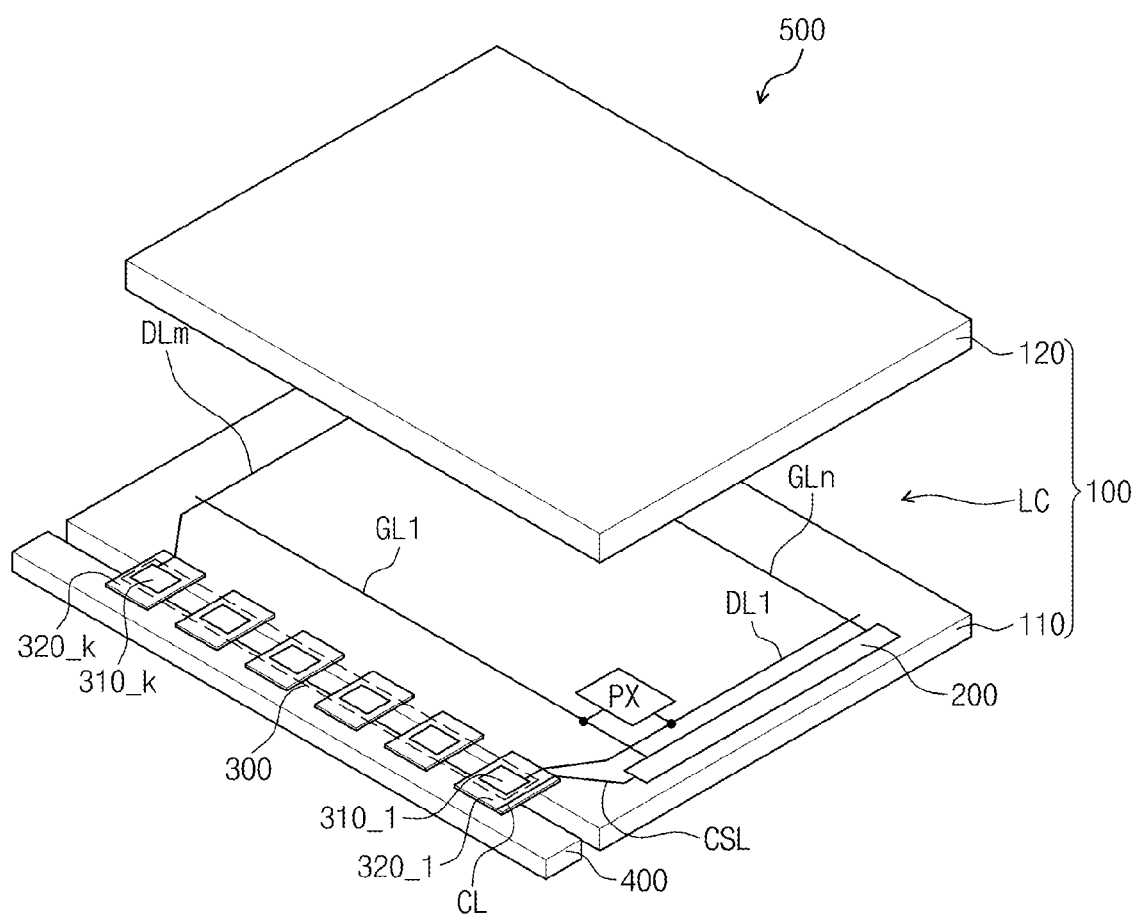

FIGS. 5A to 5C are views showing a manufacturing method of the liquid crystal display device using the thin film transistor substrate shown in FIG. 1.

Referring to FIG. 5A, the thin film transistor substrate 110 shown in FIG. 1 is prepared, but it should not be limited thereto or thereby. That is, the thin film transistor substrate 210 shown in FIG. 4 may be prepared. The structure of the thin film transistor substrate 110 has been described as the above.

To align the liquid crystal molecules in the uniform direction, the polymer alignment layer is coated on the thin film transistor substrate 110 and the rubbing process is performed using the rubbing cloth RC. As described above, the roller ROL wrapped with the rubbing cloth RC rotates at a uniform velocity to pass over the thin film transistor substrate 110 coated with the polymer alignment layer in the uniform direction. Therefore, the alignment of the liquid crystal molecules may be uniformly controlled.

As described above, the static electricity may occur during the rubbing process. The static electricity caused by the rubbing process is dispersed to the guard line GDL through the first and second static electricity dispersion parts ESD1 and ESD2. Therefore, although the static electricity occurs during the rubbing process, the elements of the gate driver 200 and the thin film transistors of the pixels PXs may be prevented from being damaged.

Referring to FIG. 5B, after the alignment process is performed on the thin film transistor substrate 110, the cutting area CA is removed by cutting the cutting line CL. When the cutting area CA is removed, the test pad parts TPD 1 and TPD2, the static electricity dispersion parts ESD1 and ESD2, and the guard line GDL are removed from the thin film transistor substrate 110.

Referring to FIG. 5C, a data driver 300, to which a driving circuit board 400 is connected, is connected to the thin film transistor substrate 110 and a color filter substrate 120 is disposed to face the thin film transistor substrate 110. The liquid crystal layer is disposed between the thin film transistor substrate 110 and the color filter substrate 120 to manufacture a display device 500.

Thus, the display device 500 includes a display panel 100, the gate driver 200, the data driver 300, and the driving circuit board 400. The display panel 100 includes the thin film transistor substrate 110 on which the pixels PXs are arranged, the color filter substrate 120 disposed to face the thin film transistor substrate 110, and the liquid crystal layer LC disposed between the thin film transistor substrate 110 and the color filter substrate 120.

The arrangements of and connections between the pixels PXs, the gate lines GL1 to GLn, the data lines DL1 to DLm, and the gate driver 200 are substantially the same as those of the thin film transistor substrate 110 shown in FIG. 1.

A connection line part CL receives a gate control signal from a timing controller (not shown) mounted on the driving circuit board 400. The connection line part CL is connected to the control signal line part CSL through the gate pad part GPD and a flexible printed circuit board 320_1 disposed at a leftmost position. Accordingly, the gate control signal is applied to the gate driver 200 through the control signal line part CSL.

The gate driver 200 generates the gate signals in response to the gate control signal. The gate signals are sequentially applied to the pixels PXs through the gate lines GL1 to GLn row by row. Therefore, the pixels PXs are driven.

The data driver 300 includes a plurality of source driving chips 310_1 to 310_k. "k" is an integer number greater than 0 and smaller than "m". The source driving chips 310_1 to 310_k are mounted on a corresponding flexible circuit board of flexible circuit boards 320_1 to 320_k and connected between the driving circuit board 400 and the data pad parts DPD.

That is, the data driver 300 may be connected to the display panel 100 in the tape carrier package (TCP) manner. However, it should not be limited thereto or thereby. That is, the source driving chips 310_1 to 310_k may be mounted in the non-display area NDA disposed adjacent to the upper portion of the display area DA in the chip on glass (COG) manner.

Although not shown in figures, the color filter substrate 120 includes a common electrode facing the pixel electrodes of the pixels PXs and color filters disposed to respectively correspond to the pixels PXs. Each color filter includes a color pixel to represent a red, green, or blue color.

The thin film transistor of each pixel PX receives the data voltage through the corresponding data line in response to the gate signal provided through the corresponding gate line. The common electrode is applied with a common voltage. The electric field is formed between the pixel electrode and the common electrode due to a difference in voltage between the data voltage and the common voltage.

The liquid crystal molecules of the liquid crystal layer LC are driven by the electric field formed between the pixel electrode and the common electrode and the alignment of the liquid crystal molecules is changed. Thus, a transmittance of the light passing through the liquid crystal molecules of the liquid crystal layer LC is controlled, and thus desired images are displayed.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A thin film transistor substrate comprising:
a plurality of pixels disposed in a display area and connected to gate lines and data lines crossing the gate lines;
a gate driver disposed in a non-display area adjacent to the display area and connected to the gate lines;
a plurality of signal pad parts disposed in the non-display area and connected to the gate driver and the data lines;
a plurality of test pad parts disposed in a cutting area adjacent to the non-display area and connected to the signal pad parts;
a plurality of static electricity dispersion parts disposed in the cutting area and connected to the plurality of test pad parts; and
a guard line disposed in the cutting area and connected to the static electricity dispersion parts, wherein the static electricity dispersion parts disperse a static electricity inflowing from the signal pad parts and the plurality of test pad parts to the guard line.

2. The thin film transistor substrate of claim 1, wherein the signal pad parts comprise:
a gate pad part connected to the gate driver; and
a plurality of data pad parts, each of which is connected to corresponding data lines of the data lines,
wherein the plurality of test pad parts comprise:
a first test pad part connected to the gate pad part; and
a plurality of second test pad parts connected to corresponding data pad parts, and
wherein the static electricity dispersion parts comprise:
a first static electricity dispersion part connected to the first test pad part; and
a plurality of second static electricity dispersion parts connected to corresponding second test pad parts.

3. The thin film transistor substrate of claim 2, wherein the gate and data pad parts are disposed in the non-display area adjacent to an upper portion of the display area, the first and second test pad parts are disposed in the cutting area adjacent to an upper portion of the non-display area, and the first and second static electricity dispersion parts are disposed at an upper portion of the first and second test pad parts.

4. The thin film transistor substrate of claim 2, wherein the gate pad part comprises a plurality of gate pads connected to the gate driver and each of the data pad parts comprises a plurality of data pads connected to the corresponding data lines of the data lines.

5. The thin film transistor substrate of claim 4, wherein the first test pad part comprises a plurality of first test pads connected to corresponding gate pads of the gate pads, and each of the second test pad parts comprises a plurality of test pads connected to corresponding data pads of the data pads.

6. The thin film transistor substrate of claim 5, wherein the gate driver sequentially applies gate signals to the pixels in response to first test signals provided through the first test pads and the gate pads, and the pixels receive second test signals through the second test pads and the data pads in response to the gate signals.

7. The thin film transistor substrate of claim 5, wherein the first static electricity dispersion part comprises a plurality of first diodes connected to corresponding first test pads and the guard line.

8. The thin film transistor substrate of claim 7, wherein an anode of each of the first diode is connected to the corresponding first test pad and cathodes of the first diodes are connected to the guard line.

9. The thin film transistor substrate of claim 5, wherein each of the second static electricity dispersion part comprises a plurality of second diodes, each of which is connected to corresponding second test pads and connected to the guard line.

10. The thin film transistor substrate of claim 9, wherein an anode of each of the second diodes is connected to corresponding second test pads and cathodes of the second diodes are connected to the guard line.

11. The thin film transistor substrate of claim 5, wherein each of the second static electricity dispersion parts comprises:
a first_second diode connected to odd-numbered second test pads of the second test pads of the corresponding second test pad part and the guard line; and
a second_second diode connected to even-numbered second test pads of the second test pas of the corresponding second test pad part and the guard line, wherein an anode of the first_second diode is connected to the odd-numbered second test pads, an anode of the second_second diode is connected to the even-numbered second test pads, and cathodes of the first_second and second_second diodes are connected to the guard line.

12. The thin film transistor substrate of claim 1, wherein the guard line is disposed to be adjacent to an edge of the thin film transistor substrate and extends along the edge of the thin film transistor substrate, and the guard line disposed in the cutting area adjacent to the upper portion of the non-display area is disposed above the first and second static electricity dispersion parts when viewed in a plan view.

13. The thin film transistor substrate of claim 1, wherein the guard line is disposed to be adjacent to an upper boundary of the thin film transistor substrate in the cutting area adjacent to the upper portion of the non-display area, extends substantially in parallel to the gate line, and is disposed above the first and second static electricity dispersion parts when viewed in a plan view.

* * * * *